United States Patent
Yamaura (10) Patent No.: US 8,634,194 B2
(45) Date of Patent: Jan. 21, 2014

(54) POWER CONVERSION APPARATUS (75) Inventor: Satoshi Yamaura, Kariya (JP)

(73) Assignee: Denso Corporation, Kariya (JP)

( * ) Notice: Subject to any disclaimer, the term of this patent is extended or adjusted under 35 U.S.C. 154(b) by 161 days.

(21) Appl. No.: 13/152,437

(22) Filed: Jun. 3, 2011

(65) Prior Publication Data
US 2011/0299243 A1 Dec. 8, 2011

(30) Foreign Application Priority Data

Jun. 3, 2010 (JP) ................................ 2010-128182
Apr. 22, 2011 (JP) ................................ 2011-095809

(51) Int. Cl.
H05K 7/20 (2006.01)

(52) U.S. Cl.
USPC ........... 361/699; 361/688; 361/700; 361/702; 361/709; 361/710; 361/711

(58) Field of Classification Search
USPC .................. 361/688, 699, 700, 709–711, 702
See application file for complete search history.

(56) References Cited

U.S. PATENT DOCUMENTS

| | | | | |
|---|---|---|---|---|
| 4,783,030 A | * | 11/1988 | Buerhop | 248/74.4 |
| 5,339,214 A | * | 8/1994 | Nelson | 361/695 |
| 5,398,748 A | * | 3/1995 | Yamaji et al. | 165/80.2 |
| 5,549,155 A | * | 8/1996 | Meyer et al. | 165/104.33 |
| 6,140,571 A | * | 10/2000 | Kitahara et al. | 174/16.3 |
| 6,469,894 B2 | * | 10/2002 | Ubukata | 361/700 |
| 6,625,021 B1 | * | 9/2003 | Lofland et al. | 361/697 |
| 6,781,835 B2 | * | 8/2004 | Hashimoto et al. | 361/697 |
| 6,845,011 B2 | * | 1/2005 | Tomioka et al. | 361/699 |
| 6,900,990 B2 | * | 5/2005 | Tomioka | 361/752 |
| 7,106,588 B2 | * | 9/2006 | Oberlin et al. | 361/700 |
| 7,215,548 B1 | * | 5/2007 | Wu et al. | 361/703 |
| 7,542,293 B2 | * | 6/2009 | Zhao et al. | 361/700 |
| 2002/0126453 A1 | * | 9/2002 | Ubukata | 361/720 |
| 2003/0024688 A1 | * | 2/2003 | Dowdy et al. | 165/80.3 |
| 2003/0183373 A1 | * | 10/2003 | Sarraf et al. | 165/104.33 |

(Continued)

FOREIGN PATENT DOCUMENTS

| | | | |
|---|---|---|---|
| GB | 2293446 A | * | 3/1996 |
| JP | 50-066343 | | 6/1975 |

(Continued)

OTHER PUBLICATIONS

Office Action (2 pages) dated Sep. 17, 2013, issued in corresponding Japanese Application No. 2011-095809 and English translation (2 pages).

Primary Examiner — Anatoly Vortman
(74) Attorney, Agent, or Firm — Nixon & Vanderhye PC (57) ABSTRACT A power conversion apparatus is provided which includes a semiconductor module which include a switching element, a cooler which cools the semiconductor module, and has a pair of cylindrical pipes which introduce a cooling medium to a channel therein or discharge the cooling medium, a frame which holds the cooler, and a pair of clamps which fix the cylindrical pipes to the frame. Each of the clamps has a fastener portion which is fastened to the frame, and a pressing portion which presses the cylindrical pipe toward the frame. Each of the cylindrical pipes is held between a concave support portion, which is formed in the frame, and the clamp. Each of the cylindrical pipes is supported by two support surfaces of the concave support portion and the pressing portion of the clamp at three support points when viewing from the direction in which the cylindrical pipe extends.

4 Claims, 7 Drawing Sheets

(56) References Cited

U.S. PATENT DOCUMENTS

| | | |
|---|---|---|
| 2004/0037045 A1* | 2/2004 | Phillips et al. ............... 361/719 |
| 2004/0042184 A1* | 3/2004 | Tomioka ...................... 361/752 |
| 2004/0109301 A1* | 6/2004 | Shih-Tsung ................. 361/829 |
| 2004/0123978 A1* | 7/2004 | Hashimoto et al. .......... 165/80.3 |
| 2004/0165350 A1* | 8/2004 | Fan ............................. 361/700 |
| 2004/0257770 A1* | 12/2004 | Hu ............................... 361/704 |
| 2005/0099776 A1* | 5/2005 | Xue et al. ..................... 361/700 |
| 2005/0141202 A1* | 6/2005 | Lee et al. ..................... 361/704 |
| 2005/0259405 A1* | 11/2005 | He ............................... 361/729 |
| 2006/0181850 A1* | 8/2006 | Frank et al. .................. 361/700 |
| 2006/0232934 A1* | 10/2006 | Kusamoto et al. ........... 361/697 |

FOREIGN PATENT DOCUMENTS

| | | | | |
|---|---|---|---|---|
| JP | S56-125511 | | 9/1981 | |
| JP | 09191440 A | * | 7/1997 | ............... H04N 5/66 |
| JP | 2009-094257 | | 4/2009 | |
| JP | 2010-124523 | | 6/2010 | |

\* cited by examiner

POWER CONVERSION APPARATUS

CROSS-REFERENCE TO RELATED APPLICATION

This application is based on and claims the benefit of priority from earlier Japanese Patent Applications No. 2010-128182 filed Jun. 3, 2010, and No. 2011-95809 filed Apr. 22, 2011, the descriptions of which are incorporated herein by reference.

BACKGROUND 1. (Technical Field)

The present invention relates to a power conversion apparatus in which a semiconductor module and a cooler, which cools the semiconductor module, are held by a frame.

2. (Related Art)

One example of power conversion apparatuses has a semiconductor module which includes switching elements and a cooler which cools the switching elements. In addition, when holding the cooler by a frame, which holds the switching elements and the cooler inside thereof, a clamp may be used to fix the cooler to the frame. That is, the cooler can be fixed to the frame by fixing a cylindrical pipe, which introduces or discharges a cooling medium stored in the cooler, to the frame by the clamp.

As disclosed in JP-UM-A-56-125511, the clamp generally has a pressing portion which has an arched shape along the outline of the cylindrical pipe. Meanwhile, a fastener portion fastening the clamp to the frame has a flat plate shape.

Hence, an inner projecting portion, which projects to the side of the cylindrical pipe, is formed at the boundary between the fastener portion and the pressing portion (refer to the comparative example and FIG. 12 described later).

However, when the inner projecting portion is formed on the clamp, the inner projecting portion may dig into the cylindrical pipe depending on the arrangement by which the clamp holds the cylindrical pipe. This can locally crush the cylindrical pipe.

In addition, when the clamp is in a state where the curved surface of the arched pressing portion of the clamp contacts the curved outer periphery surface of the cylindrical pipe, pressure from the clamp cannot be linearly applied to the frame. That is, when the contact surface between the clamp and the cylindrical pipe has an arched shape, it is difficult to keep the direction in which the pressure is applied constant. The pressure can be applied in the direction diagonal to the direction in which the pressure is applied to the frame. In this case, the pressure may be applied in the direction in which the cylindrical pipe would detach from is the frame. This can make it difficult to steadily fix the cylindrical pipe.

SUMMARY

An embodiment provides a power conversion apparatus in which a cylindrical pipe is prevented from being deformed, and a cooler is stably fixed to a frame.

As an aspect of the embodiment, a power conversion apparatus is provided which includes: a semiconductor module which include a switching element; a cooler which cools the semiconductor module, and has a pair of cylindrical pipes which introduce a cooling medium to a channel therein or discharge the cooling medium; a frame which holds the cooler; and a pair of clamps which fix the cylindrical pipes to the frame, wherein each of the clamps has a fastener portion which is fastened to the frame, and a pressing portion which presses the cylindrical pipe toward the frame, each of the cylindrical pipes is held between a concave support portion, which is formed in the frame, and the clamp, and each of the cylindrical pipes is supported by two support surfaces of the concave support portion and the pressing portion of the clamp at three support points when viewing from the direction in which the cylindrical pipe extends.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

(First Embodiment)

FIGS. 1 to 6 are diagrams concerning a power conversion apparatus according to an embodiment of the present invention.

Figure 4:
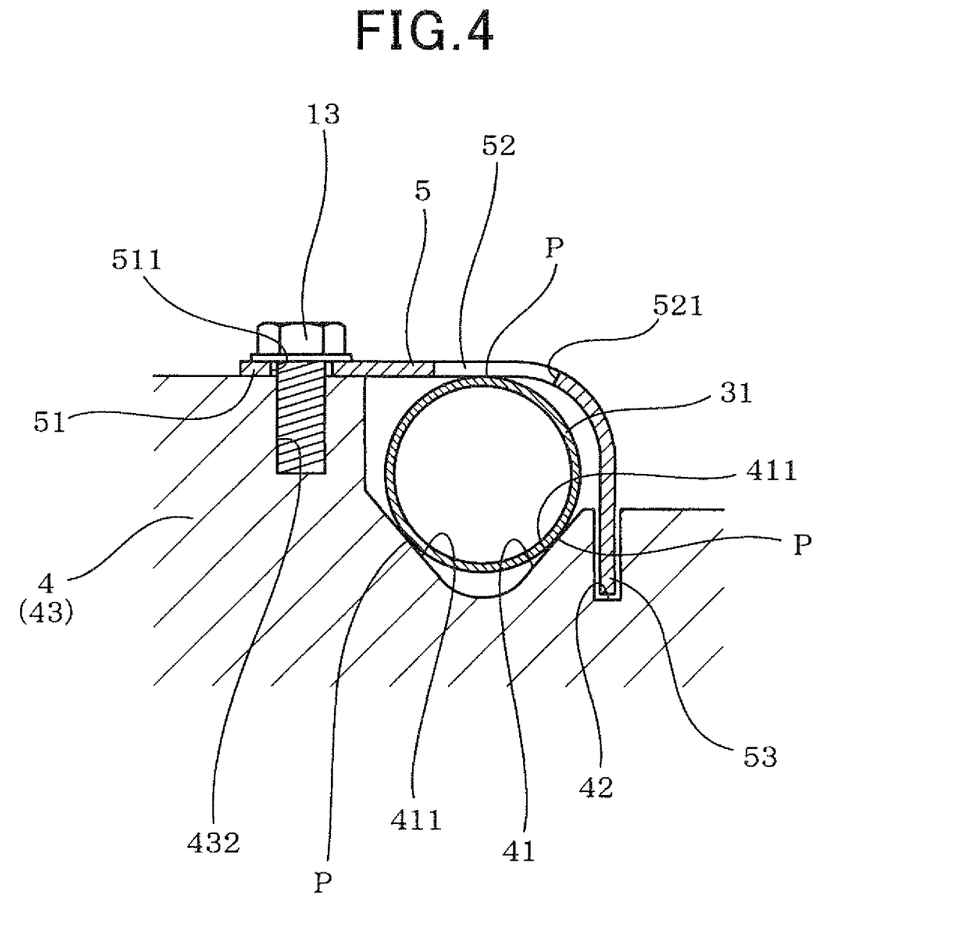
FIG. 4 is a sectional view taken along arrows A-A in FIG. 3.

A power conversion apparatus 1 has, as shown in FIG. 4, semiconductor modules 2, a cooler 3, a frame 4, and a clamp 5. The semiconductor modules 2 include switching elements. The cooler 3 cools the semiconductor modules 2, and has a pair of cylindrical pipes 31 which introduce a cooling medium to a cooling medium channel therein or discharge the cooling medium. The frame 4 holds the cooler 3. The clamp 5 fixes the cylindrical pipe 31 to the frame 4.

Figure 5:
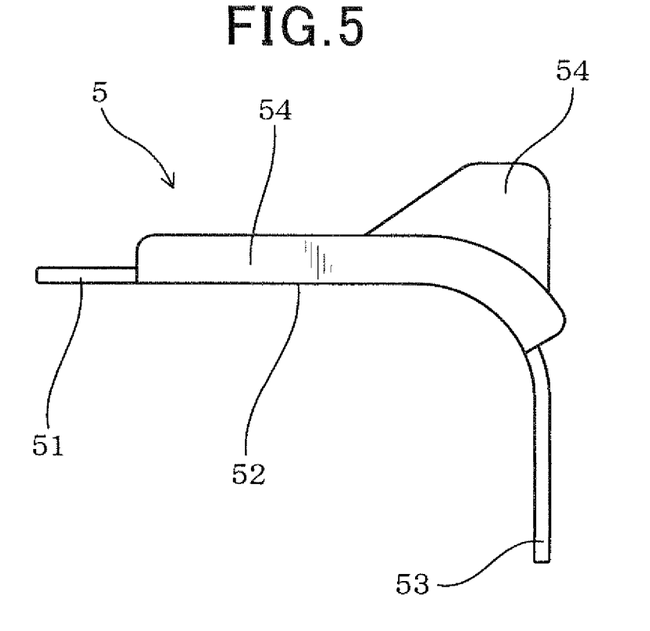
FIG. 5 is a front view of the clamp according to the first embodiment.

As shown in FIGS. 2 to 6, the clamp 5 has a fastener portion 51 which is fastened to the frame 4, and a pressing portion 52 which presses the cylindrical pipes 31 toward the frame 4 side. As shown in FIGS. 4 and 5, the clamp 5 has a shape in which the fastener portion 51 and the pressing portion 52 are aligned when viewing from the direction in which the cylindrical pipe 31 extends.

As shown in FIG. 4, the cylindrical pipe 31 is held between a concave support portion 41, which is formed in the frame 4, and the clamp 5.

The concave support portion 41 has a pair of inclined surfaces 411 which are inclined with respect to the opening direction of the concave support portion 41. The inclined surfaces 411 serve as support surfaces which support the cylindrical pipe 31 from the frame 4 side, The cylindrical pipe 31 is supported by the pair of inclined surfaces 411 of the concave support portion 41 and the pressing portion 52 of the clamp 5, that is, at three support points P. The three support points P are located so as to be vertexes (tops, corners) of an equilateral triangle.

Figure 2:
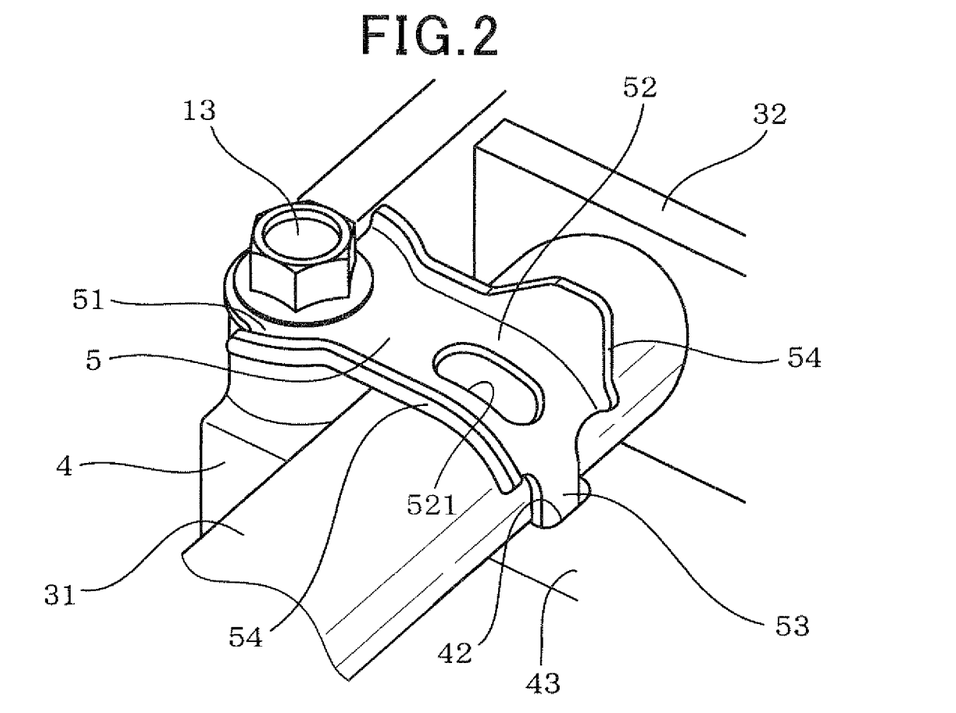
FIG. 2 is a perspective view of a fixing structure of a cylindrical pipe using a clamp according to the first embodiment.
Figure 3:
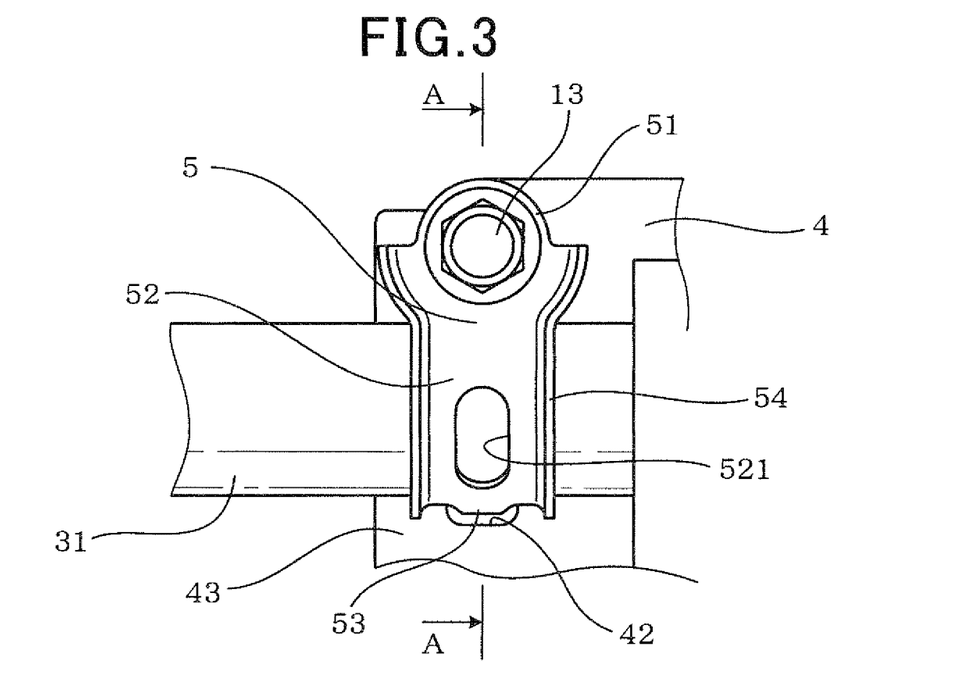
FIG. 3 is a plan view of the fixing structure of the cylindrical pipe using the clamp according to the first embodiment.
Figure 6:
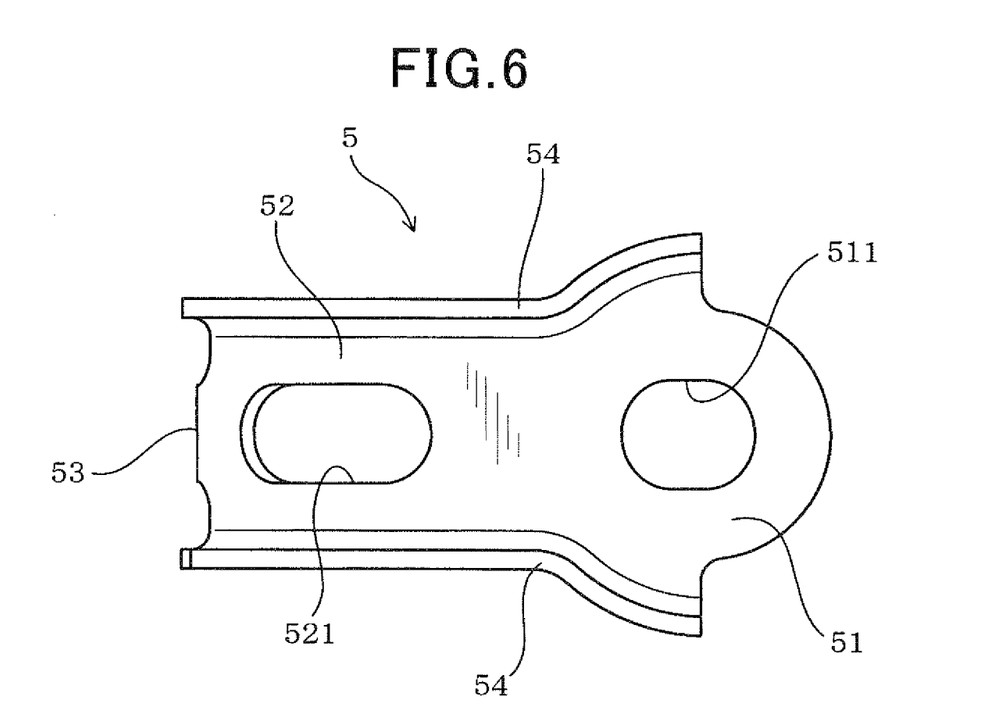
FIG. 6 is a plan view of the clamp according to the first embodiment.

As shown in FIGS. 5 and 6, the clamp 5 has the fastener portion 51 and an engagement portion 53 with the pressing portion 52 being interposed therebetween. As shown in FIGS. 2 to 4, the engagement portion 53 is engaged in the frame 4. That is, the frame 4 is provided with an engagement hole 42 into which the engagement portion 53 can be inserted. The engagement portion 53 of the clamp 5 is inserted into the engagement hole 42. Hence, the engagement portion 53 is prohibited from moving in the direction parallel to the cylindrical pipe 31.

Figure 1:
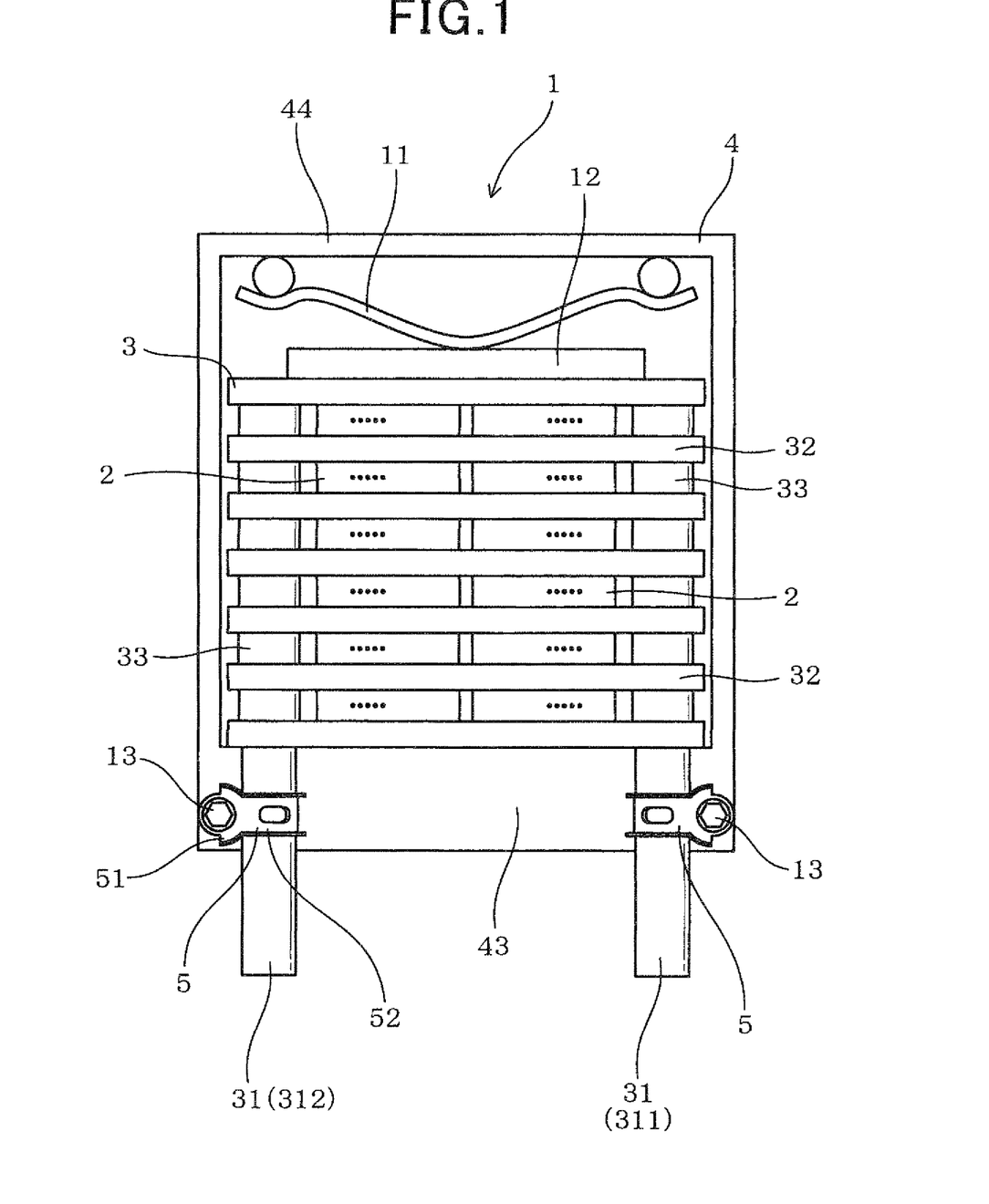
FIG. 1 is a plan view of a power conversion apparatus according to the first embodiment.

As shown in FIG. 1, the cooler 3 has a configuration in which a plurality of cooling pipes 32 are stacked at predetermined intervals, and the adjacent cooling pipes 32 are connected to each other by using connecting portions 33 at both ends in the longitudinal direction of the cooling pipes 32. Each of the cooling pipes 32 has a cooling medium channel in which a cooling medium flows. The pair of the cylindrical pipes 31, which individually either introduce the cooling medium to the cooler 3 or discharges the cooling medium, are connected to opposite ends in the longitudinal direction of the cooling pipes 32 and are disposed at one end (i.e. the front end) in the stacking direction of the cooler 3.

One of the pair of the cylindrical pipes 31 is a cooling medium introduction pipe 311 for introducing the cooling medium into the cooler 3. The other of the pair of the cylindrical pipes 31 is a cooling medium discharge pipe 312 for discharging the cooling medium from the cooler 3.

Semiconductor modules 2 are disposed between the adjacent cooling pipes 32. The semiconductor module 2 is sandwiched between the pair of the cooling pipes 32 from the sides of both main surfaces of the semiconductor module 2. That is, the plurality of the cooling pipes 32 and the plurality of the semiconductor modules 2 are alternately stacked.

According to the configuration, the cooling medium introduced from one of the cylindrical pipes 31 (cooling medium introduction pipe 311) passes through the connecting portions 33, and is distributed to the cooling pipes 32, thereby flowing in the longitudinal directions of the cooling pipes 32. While flowing in the cooling pipes 32, the cooling medium performs heat exchange with the semiconductor modules 2. The cooling medium, whose temperature has risen by the heat exchange, passes through the downstream connecting portions 33, and is introduced into the other of the cylindrical pipes 31 (cooling medium introduction pipe 312), thereby being discharged from the cooler 3.

In addition, the stacked body of the cooling pipes 32 and the semiconductor modules 2 are disposed in the frame 4. The stacked body is pressed in the stacking direction by a spring member 11 from the other end (rear end) in the stacking direction of the cooler 3. That is, the cooling pipe 32 disposed on the front end of the stacked body contacts a front wall 43 of the frame 4. The spring member 11, which is energized in the stacking direction in which the spring member 11 expands, is disposed between a rear wall 44 of the frame 4 and the cooling pipe 32 disposed on the rear end of the stacked body. A contact plate 12 is disposed between the spring member 11 and the cooler 3 to prevent the cooling pipe 32 from being deformed.

A pair of the concave support portions 41 (FIG. 4) is formed in the front end wall 43 of the frame 4. A pair of the cylindrical pipes 31 is respectively supported by the pair of the concave support portions 41. Screw holes (female screws) 432, into which bolts 13 are screwed, are formed at portions of the front end wall 43 adjacent to the concave support portions 41. The engagement holes 42 are formed at positions opposite to the screw holes 432 with respect to the concave support portions 41.

As shown in FIGS. 5 and 6, the clamp 5 has the fastener portion 51 and the pressing portion 52, which are formed so as to be aligned, and the engagement portion 53, which extends in the direction perpendicular to the fastener portion 51 and the pressing portion 52. The pressing portion 52 and the engagement portion 53 are connected to each other in a curve. The fastener portion 51 is provided with a through hole 511 into which the bolt 13 is inserted. An opening 521 is provided at the pressing portion 52 and at the periphery thereof. Ribs 54 are provided at both sides in the width direction of the clamp 5 from the mid portion of the fastener portion 51 to the portion between the pressing portion 52 and the engagement portion 53.

As shown in FIGS. 1 to 4, when fastening the cylindrical pipe 31 to the frame 4 by using the clamp 5, the cooler 3 is disposed on the frame 4 first. In this case, a pair of the cylindrical pipes 31 is respectively disposed on a pair of the concave support portions 41 provided in the front wall 43 of the frame 4.

Next, the clamp 5 is disposed so as to cover the cylindrical pipe 31 in a state where the engagement portion 53 of the clamp 5 is inserted into the engagement hole 42 provided in the front wall 43.

Next, the bolt 13 is inserted into the through hole 511 provided in the fastener portion 51 of the clamp 5. Then, the bolt 13 is screwed into the screw hole 432 provided in the front wall 43 of the frame 4. Hence, the clamp 5 is fastened to the frame 4, while the pressing portion 52 is brought into contact with the cylindrical pipe 31. In this case, since the engagement portion 53 of the clamp 5 is engaged with the engagement hole 42 of the frame 4, the clamp 5 is prohibited from rotating with the bolt 13, whereby the pressing portion 52 of the clamp 5 can press the cylindrical pipe 31 toward the frame 4 at the exact required position.

According to the above configuration, the cylindrical pipe 31 is supported by the concave support portion 41, while the cylindrical pipe 31 is fixed to the frame 4 by the clamp 5.

Note that the cooler 3 including the cylindrical pipes 31 and the frame 4 are made of metal such as aluminum. The clamp 5 is made of metal such as SECC (electrolytic zinc-coated carbon steel sheets).

Next, advantages of the embodiment will be described.

The clamp 5 of the power conversion apparatus 1 has a shape in which the fastener portion 51 and the pressing portion 52 are aligned when viewing from the direction in which the cylindrical pipe 31 extends. Hence, as shown in FIG. 4, the clamp 5 does not have a shape in which the part between the fastener portion 51 and the pressing portion 52 extends to the side of the cylindrical pipe 31 (refer to the comparative example described later and FIG. 12). Hence, even when the cylindrical pipe 31 is pressed toward the frame 4 side by the pressing portion 52, a large local force is prevented from being applied to the cylindrical pipe 31. Accordingly, the cylindrical pipe 31 is prevented from being deformed.

In addition, the pressing portion 52 and the fastener portion 51 are aligned. That is, the pressing portion 52 has a flat plate shape. Hence, since the pressing portion 52 is in substantially line contact with the cylindrical pipe 31 from the side opposite to the frame 4, the pressing portion 52 can press the cylindrical pipe 31 toward the frame 4 side in a constant direction. Hence, the force is not applied in the direction diagonal to the constant direction, whereby the force can be prevented from being applied in the direction in which the cylindrical pipe 31 would detach from the frame 4. Accordingly, the cooler 3 can be stably fixed to the frame 4.

In addition, the concave support portion 41 has a pair of the inclined surfaces 411. The cylindrical pipe 31 is supported by a pair of the inclined surfaces 411 and the pressing portion 52 of the clamp 5, that is, at the three support points P. Hence, since the cylindrical pipe 31 is supported by the frame 4 and the clamp 5, that is, at the three support points, the cylindrical pipe 31. is more stably fixed.

Since the three support points P are located so as to be vertexes of an equilateral triangle, the cylindrical pipe 31 is supported at the three support points P in a balanced manner, whereby the cylindrical pipe 31 can be fixed to the frame 4 more stably.

In addition, the clamp 5 has the engagement portion 53 which engages with the frame 4. Hence, the clamp 5 can be prevented from being displaced, whereby the cylindrical pipe 31 is more reliably fixed by the clamp 5. Specifically, when the clamp 5 is fastened to the frame 4 by the bolt 13, the clamp 5 can be prevented from rotating with the bolt 13, whereby the clamp 5 can be prevented from being displaced. In addition, even before the clamp 5 is fastened to the frame 4, the clamp 5 can be temporarily placed on the frame 4 easily, thereby facilitating the assembly of the clamp 5.

As described above, according to the embodiment, a power conversion apparatus can be provided in which a cylindrical pipe is prevented from being deformed, and a cooler is stably fixed to a frame.

(Second Embodiment)

Figure 7:
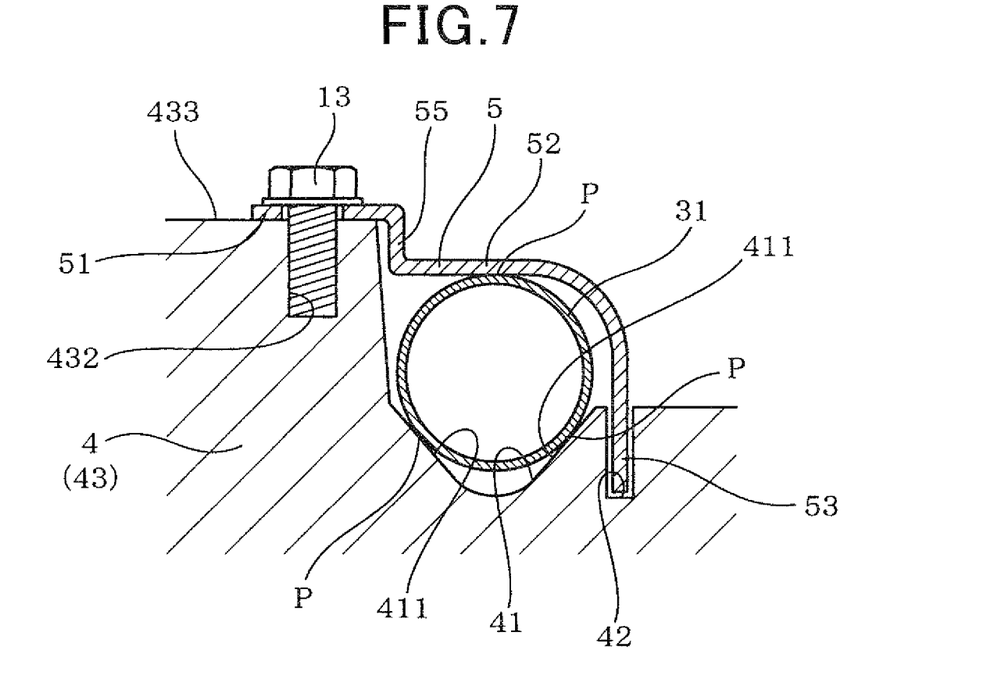
FIG. 7 is a sectional view of a fixing structure of the cylindrical pipe using a clamp according to the second embodiment.

In the embodiment, as shown in FIG. 7, the clamp 5 is provided with a step portion 55 between the fastener portion 51 and the pressing portion 52.

In the embodiment, the fastener portion 51 and the pressing portion 52 of the damp 5 are not aligned. The fastener portion 51 is apart from the cylindrical pipe 31 compared with the pressing portion 52 in the direction in which the clamp 5 presses the cylindrical pipe 31. The step portion 55 bends at a substantially right angle with respect to the fastener portion 51 and the pressing portion 52 so as to connect the fastener portion 51 and the pressing portion 52.

In addition, in the embodiment, a fixing surface 433, to which the fastener portion 51 is fixed, of the front wall 43 of the frame 4 is located at a position higher than an upper end of the cylindrical pipe 31 supported by the concave support portion 41. Note that although the upper end is on the upper side in FIG. 7, the upper end is not always on the upper side in is the vertical direction depending on the attitude of the power conversion apparatus 1.

Other configurations are the same as those of the first embodiment.

According to the second embodiment, the same advantages as those of the first embodiment can also be obtained.

Note that, as a configuration different from that of the second embodiment, a step portion may be formed so that the fixing surface 433 of the front wall 43 is located at the position lower than the upper end of the cylindrical pipe 31 supported by the concave support portion 41, and the pressing portion 52 of the clamp 5 is located at the position higher than the fastener portion 51.

(Third Embodiment)

Figure 8:
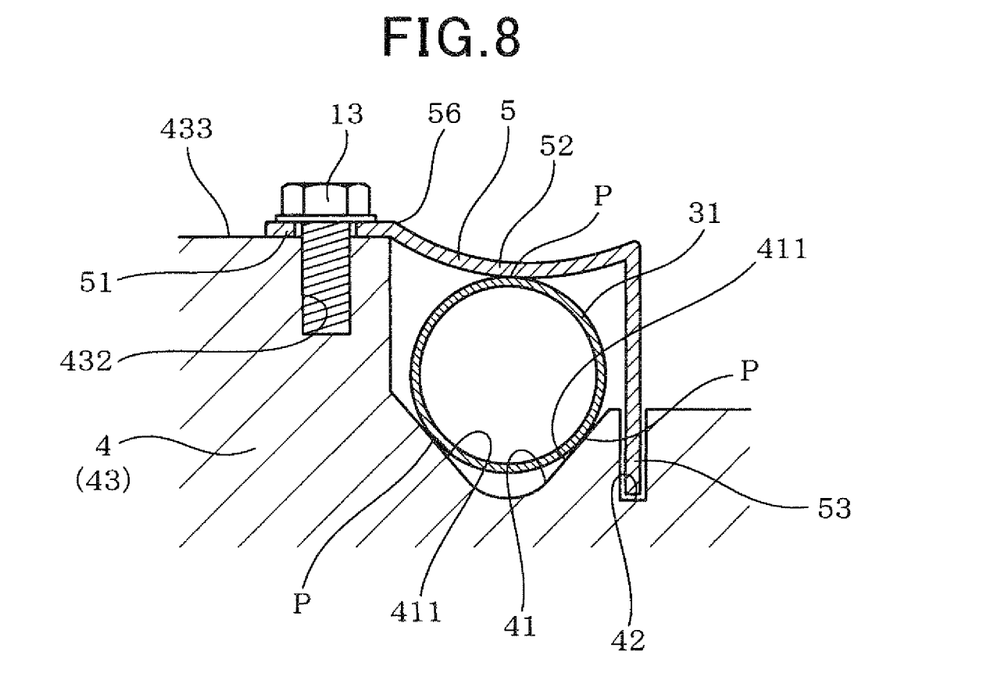
FIG. 8 is a sectional view of a fixing structure of the cylindrical pipe using a clamp according to the third embodiment.

In the embodiment, as shown in FIG. 8, the clamp 5 is used in which the pressing portion 52 is curved in the pressing direction so that the pressing portion 52 has a convex arced shape.

In addition, the curvature of the arc of the pressing portion 52 is smaller than that of the cylindrical pipe 31 (the curvature radius of the arc of the pressing portion 52 is larger than that of the cylindrical pipe 31).

In addition, a bend portion 56, which projects to the side opposite to the cylindrical pipe 31, is formed between the fastener portion 51 and the pressing portion 52.

Other configurations are the same as those of the first embodiment.

According to the third embodiment, the same advantages as those of the first embodiment can also be obtained.

(Fourth Embodiment)

Figure 9:
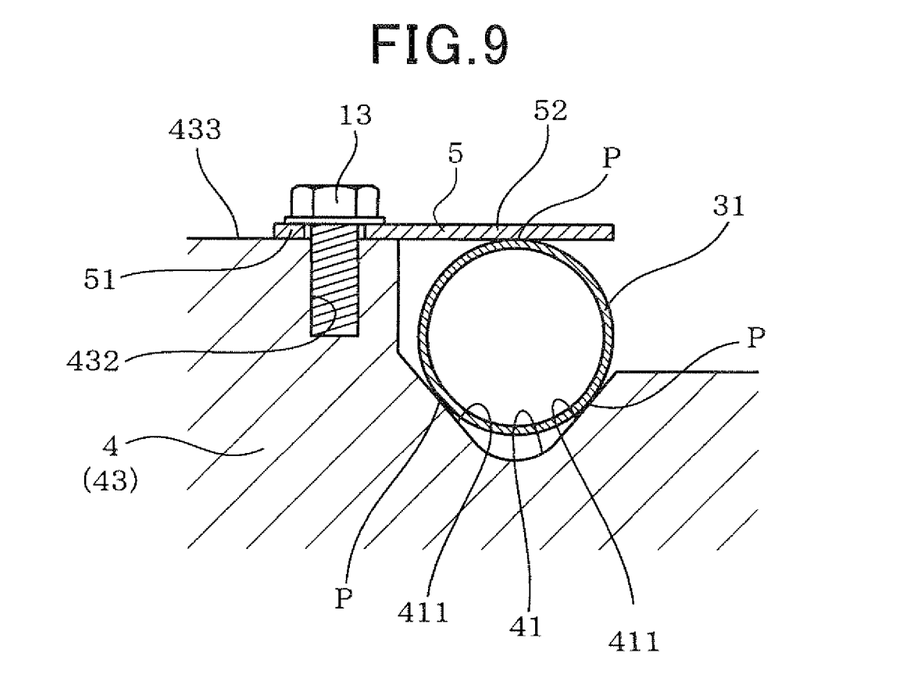
FIG. 9 is a sectional view of a fixing structure of the cylindrical pipe using a clamp according to the fourth embodiment.

In the embodiment, as shown in FIG. 9, the clamp 5 is used which is not provided with the engagement portion 53 (referring to FIG. 4).

In the embodiment, the clamp 5 has a linear shape when viewing from the direction in which the cylindrical pipe 31 extends.

Other configurations are the same as those of the first embodiment.

According to the embodiment, the shape of the clamp 5 can be simplified.

In addition, since the frame 4 is not required to be provided with the engagement holes 42, the shape of the frame 4 can also be simplified. Other configurations are the same as those of the first embodiment.

Note that the clamp 5 can be prevented from turning by using a means other than the means engaging the engagement portion 53 with the engagement hole 42.

(Fifth Embodiment)

Figure 10:
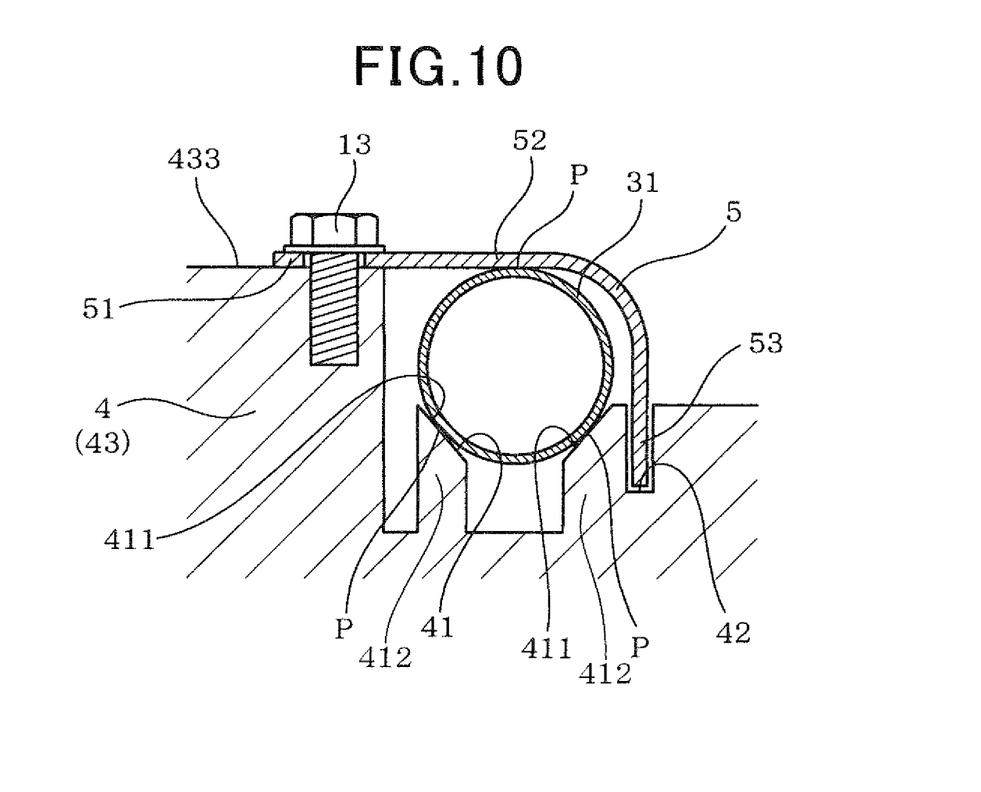
FIG. 10 is a sectional view of a fixing structure of the cylindrical pipe using a clamp according to the fifth embodiment.

In the embodiment, as shown in FIG. 10, the shape of the concave support portion 41 is modified.

In the embodiment, the concave support portion 41 is configured with two erecting portions (posts) 412. The erecting portions 412 are respectively provided with the inclined surfaces 411 which are inclined so as to be opposed to each other. The cylindrical pipe 31 is supported by the two inclined surfaces 411 and the pressing portion 52 of the clamp 5, that is, at three support points P, when viewing from the direction in which the cylindrical pipe 31 extends.

Other configurations are the same as those of the first embodiment.

According to the fifth embodiment, the same advantages as those of the first embodiment can also be obtained.

(Sixth Embodiment)

Figure 11:
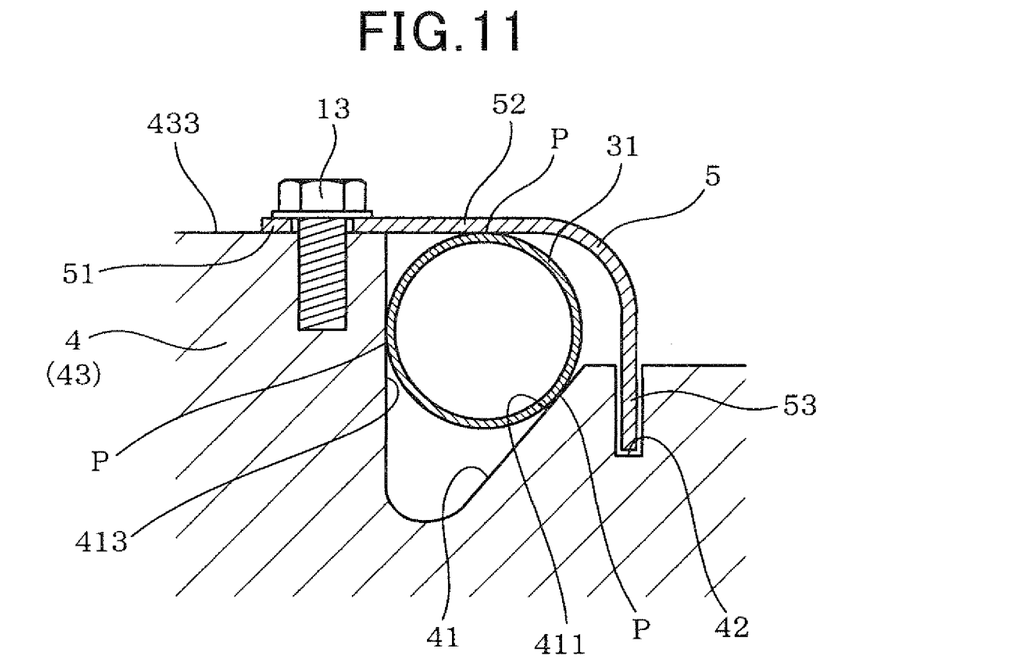
FIG. 11 is a sectional view of a fixing structure of the cylindrical pipe using a clamp according to the sixth embodiment.

In the embodiment, as shown in FIG. 11, the shape of the concave support portion 41 is modified.

In the embodiment, the concave support portion 41, which supports the cylindrical pipe 31, has two support surfaces. One of the support surfaces is an inclined surface 411, and the other of the support surfaces is a vertical surface 413. That is, the inclined surface 411 is inclined with respect to the fixing surface 433 of the front wall 43 of the frame 4. The vertical surface 413 is perpendicular to the fixing surface 433.

Other configurations are the same as those of the first embodiment.

According to the sixth embodiment, the shape of the concave support portion 41 can be simplified.

Other configurations are the same as those of the first embodiment.

COMPARATIVE EXAMPLE

Figure 12:
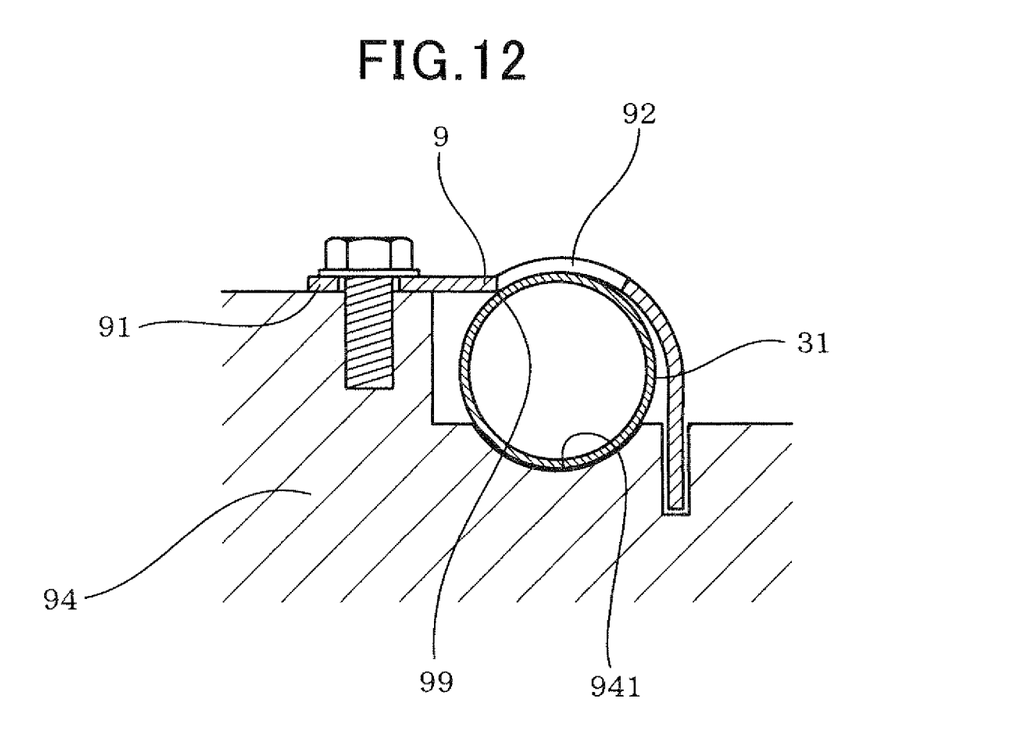
FIG. 12 is a sectional view of a fixing structure of the cylindrical pipe using a clamp according to a comparative example.

In the example, as shown in FIG. 12, the cylindrical pipe 31 is fixed to the frame 94 by using a clamp 9 in which a pressing portion 92 is formed which has an arched shape along the outline of the cylindrical pipe 31.

At the boundary between a fastener portion 91 having a flat plate shape and the pressing portion 92, an inner projecting portion 99, which projects to the side of the cylindrical pipe 31, is formed.

In the fixing structure of the example, the concave support portion 941 of the frame 94 also has an arched shape along the outline of the cylindrical pipe 31.

Other configurations are the same as those of the first embodiment.

When the inner projecting portion 99 is formed on the clamp 9, as in the case of the example, the inner projecting portion 99 may dig into the cylindrical pipe 31 depending on the state in which the clamp 9 holds the cylindrical pipe 31. This can locally crush the cylindrical pipe 31.

In addition, when the clamp 9 is in a state where the curved surface of the arched pressing portion 92 of the clamp 9 contacts the curved outer periphery surface of the cylindrical pipe 31, pressure from the clamp 9 cannot be linearly applied to the frame 94. That is, when the contact surface between the clamp 9 and the cylindrical pipe 31 has an arched shape, it is difficult to apply pressure in a constant direction. The pressure can be applied in the direction diagonal to the direction in which the pressure is applied to the frame 94. In this case, the pressure may be applied in a direction in which the cylindrical pipe 31 would detach from the frame 94, This can make it difficult to steadily fix the cylindrical pipe 31.

In addition, since the concave support portion 941 of the frame 94 has an arched shape along the outline of the cylindrical pipe 31, the surface of the cylindrical pipe 31 and the surface of the frame 94 also contact with each other at the concave support portion 941. Alternatively, when the curvature radiuses of the pressing portion 92 of the clamp 9 and the concave support portion 941 of the frame 94 are larger than the curvature radius of the cylindrical pipe 31, the cylindrical pipe 31 is supported by the pressing portion 92 and the concave support portion 941 at two points.

Therefore, three-point supporting as shown in the first embodiment cannot be realized in the comparative example, whereby a stable fixing structure is difficult to obtain.

However, according to the first embodiment, the problems of the comparative example described above are not caused. Accordingly, a power conversion apparatus can be provided in which a cylindrical pipe is prevented from being deformed, and a cooler is stably fixed to a frame.

Hereinafter, aspects of the above-described embodiments will be summarized.

As an aspect of the embodiment, a power conversion apparatus is provided which includes: a semiconductor module which include a switching element; a cooler which cools the semiconductor module, and has a pair of cylindrical pipes which introduce a cooling medium to a channel therein or discharge the cooling medium; a frame which holds the cooler; and a pair of clamps which fix the cylindrical pipes to the frame, wherein each of the clamps has a fastener portion which is fastened to the frame, and a pressing portion which presses the cylindrical pipe toward the frame, each of the cylindrical pipes is held between a concave support portion, which is formed in the frame, and the clamp, and each of the cylindrical pipes is supported by two support surfaces of the concave support portion and the pressing portion of the clamp at three support points when viewing from the direction in which the cylindrical pipe extends.

In the power conversion apparatus, each of the cylindrical pipes is supported by two support surfaces of the concave support portion and the pressing portion of the clamp at three support points, when viewing from the direction in which the cylindrical pipe extends. Hence, the cylindrical pipes can be stably fixed to the frame.

When viewing from the direction in which the cylindrical pipe extends, the cylindrical pipe is supported at the three support points, and the pressing portion of the clamp supports the cylindrical pipe at one point. Hence, if external force is applied so that the relative positions between the clamp and the cylindrical pipe are slightly displaced in the direction perpendicular to both of the direction in which the cylindrical pipe extends and the direction in which the clamp presses, the state is not changed in which the pressing portion presses the cylindrical pipe.

That is, as described above, if the outer periphery surface of the cylindrical pipe is pressed by the pressing portion which has an arched shape along the outline of the cylindrical pipe, an inner projecting portion, which projects to the side of the cylindrical pipe, is formed at one end of the arched pressing portion. In this case, when the above external force is applied, the inner projecting portion digs into the cylindrical pipe. This can locally crush the cylindrical pipe. However, when the arched pressing portion is not in surface contact but in substantially line contact with the cylindrical pipe, the inner projecting portion is not provided in the vicinity of the pressing portion. Thereby, the cylindrical pipe cannot be locally crushed.

In addition, as described above, since the pressing portion is in substantially line contact with the cylindrical pipe from the side opposite to the frame, the pressing portion can press the cylindrical pipe toward the frame in a constant direction. Hence, the force is not applied in a direction diagonal to the constant direction, whereby the force can be prevented from being applied in the direction in which the cylindrical pipe would detach from the frame. Accordingly, the cooler can be stably fixed to the frame.

As described above, according to the embodiments, the power conversion apparatus can be provided in which the cylindrical pipe is prevented from being deformed, and the cooler is stably fixed to the frame.

In the embodiments, preferably, the concave support portion has a pair of inclined surfaces as the support surfaces which are inclined with respect to the opening direction of the concave support portion, and each of the cylindrical pipes is supported by the pair of inclined surfaces of the concave support portion and the pressing portion of the clamp at three support points.

In this case, since the cylindrical pipe is supported by the frame and the clamp at the three support points, the cylindrical pipe can be more stably fixed.

In addition, the three support points are preferably located so as to be vertexes of an equilateral triangle.

In this case, the cylindrical pipe is supported at the three support points in a balanced manner, whereby the cylindrical pipe can be fixed to the frame more stably.

In addition, preferably, each of the clamps has an engagement portion, the pressing portion being interposed between the fastener portion and the engagement portion, and the engagement portion is engaged in the frame.

In this case, the clamp can be prevented from being displaced, whereby the cylindrical pipe is more reliably fixed by the clamp. Specifically, when the clamp is fastened to the frame by the bolt, the clamp might try to rotate with the bolt. In such a case, due to the engagement portion being engaged in the frame, the clamp can be prevented from rotating, whereby the clamp can be prevented from being displaced.

In addition, even before the clamp is fastened to the frame, the clamp can be temporarily placed on the frame easily, thereby facilitating the assembly of the clamp.

In addition, the fastener portion and the pressing portion are preferably aligned when viewing from the direction in which the cylindrical pipe extends.

In this case, the clamp does not have a shape in which the part between the fastener portion and the pressing portion extends to the side of the cylindrical pipe. Hence, even when the cylindrical pipe is pressed toward the frame by the pressing portion, local large force is prevented from being applied to the cylindrical pipe. Accordingly, the cylindrical pipe is prevented from being deformed.

In addition, the pressing portion and the fastener portion are aligned. That is, the pressing portion has a flat plate shape. Hence, since the pressing portion is in substantially line contact with the cylindrical pipe from the side opposite to the frame, the pressing portion can press the cylindrical pipe toward the frame in a constant direction. Hence, the force is not applied in the direction diagonal to that direction, whereby the force can be prevented from being applied in a direction in which the cylindrical pipe would detach from the frame. Accordingly, the cooler can be stably fixed to the frame.

It will be appreciated that the present invention is not limited to the configurations described above, but any and all modifications, variations or equivalents, which may occur to those who are skilled in the art, should be considered to fall within the scope of the present invention.

What is claimed is:

1. A power conversion apparatus, comprising:
   a semiconductor module which include a switching element;
   a cooler which cools the semiconductor module, and has a pair of cylindrical pipes which introduce a cooling medium to a channel therein or discharge the cooling medium;
   a frame which holds the cooler; and
   a pair of clamps which fix the cylindrical pipes to the frame, wherein:
   each of the clamps has a fastener portion which is fastened to the frame, and a pressing portion which presses the cylindrical pipe toward the frame,
   each of the cylindrical pipes is held between a concave support portion, which is formed in the frame, and the clamp,
   each of the cylindrical pipes is supported by two support surfaces of the concave support portion and the pressing portion of the clamp at three support points when viewing from the direction in which the cylindrical pipe extends,
   the concave support portion has a pair of inclined surfaces as the support surfaces which are inclined with respect to the opening direction of the concave support portion, and
   each of the cylindrical pipes is supported by the pair of inclined surfaces of the concave support portion and the pressing portion of the clamp at three support points.

2. The power conversion apparatus according to claim 1, wherein
   the three support points are located so as to be vertexes of an equilateral triangle.

3. The power conversion apparatus according to claim 1 wherein
   each of the clamps has an engagement portion, the pressing portion being interposed between the fastener portion and the engagement portion, and
   the engagement portion is engaged in the frame.

4. The power conversion apparatus according to claim 1, wherein
   the fastener portion and the pressing portion are aligned when viewing from the direction in which the cylindrical pipe extends.

* * * * *